United States Patent [19]

Koplin et al.

[11] 4,132,235

[45] Jan. 2, 1979

[54] APPARATUS FOR TREATING PRINTING PLATES

[75] Inventors: Eckhard Koplin, Birkenheide; Horst Hoffmann, Wachenheim; Siegfried Raiff, Weinheim; Peter Richter, Ludwigshafen; Helmut Kaufmann, Reilingen, all of Fed. Rep. of Germany

[73] Assignee: BASF Aktiengesellschaft, Ludwigshafen, Fed. Rep. of Germany

[21] Appl. No.: 860,871

[22] Filed: Dec. 15, 1977

[30] Foreign Application Priority Data

Dec. 18, 1976 [DE] Fed. Rep. of Germany ....... 2657558

[51] Int. Cl.$^2$ ................................................ B08B 3/02
[52] U.S. Cl. .................................... 134/99; 134/112; 134/133; 134/148; 134/165; 134/200
[58] Field of Search .................................... 134/94–95, 134/99, 103–104, 112, 133–135, 148, 151, 164–165, 200

[56] References Cited

U.S. PATENT DOCUMENTS

| | | | |
|---|---|---|---|
| 2,566,142 | 8/1951 | Powers, Sr. | 134/94 |
| 2,669,241 | 2/1954 | Foote | 134/133 |
| 3,406,697 | 10/1968 | Mitchell et al. | 134/148 |
| 3,459,202 | 8/1969 | Roberson | 134/99 |
| 3,734,108 | 5/1973 | Almegard et al. | 134/103 X |

Primary Examiner—Robert L. Bleutge
Attorney, Agent, or Firm—Keil, Thompson & Shurtleff

[57] ABSTRACT

An apparatus for treating photopolymer printing plates, which have already been exposed, with liquid media, in which the plate, mounted on a vertically movable holder, can be moved up and down between an upper loading and unloading chamber and a lower treatment chamber, separated from the upper chamber by a partially open partition, and in which upper and lower rim elements of the plate holder seal the aperture in the partition in a vapor-tight manner when the plate holder is in its terminal positions.

5 Claims, 2 Drawing Figures

APPARATUS FOR TREATING PRINTING PLATES

The present invention relates to an apparatus for treating, especially for washing out and rinsing, photopolymer printing plates, in which a plate, occupying a vertical position on a controllably movable holder, is moved up and down between a loading and unloading chamber and a treatment chamber.

German Published Application DAS No. 1,960,906 discloses a development apparatus, comprising at least three chambers, for printing plates, in which the plates are transported horizontally from a plate mounting station, through the multi-compartment treatment chamber in which spray devices are installed, to the plate removal chamber, which stations are arranged in a single line. The plate to be developed is fixed on a carrier, the back of which is engaged by a plurality of motor-driven shafts fitted with rollers to effect horizontal movement of the carrier with the printing plate. The printing plate forms an angle of from 60 to 88° C. with the horizontal, and the angular position of the nozzle battery, facing the plate, for applying the treatment liquids also corresponds to this inclined position. The treatment chamber is in turn divided into a developing chamber and a fixing chamber, so that altogether, in order to seal these chambers off from the plate mounting station and the plate removal chamber, at least four vertical partitions are required, the openings in which have to be fitted with sleeves of an elastic material. Furthermore, the plurality of driven shafts with transport rollers, most of which have to run in the moist atmosphere of the treatment chambers, means that such machines are expensive and complicated. The construction entailing horizontally adjoining stations for mounting, treating and removing the plates further requires a considerable amount of space in the printing shop, which is not compensated for by the advantage of the stations, arranged downstream of one another in a single line, being able to treat several plates simultaneously. Furthermore, this conventional construction has the disadvantage that the housing, which encloses all the chambers and the drive means for plate transportation, cannot be designed with a tight enough seal to prevent vapors of the treatment medium escaping therefrom, i.e. to prevent the operators in the working area from being exposed to these vapors.

It is therefore an object of the present invention to provide an apparatus for treating photopolymer printing plates, which requires little space and is suitable even for relatively small printing shops, and in which transport members for the plate carrier, which members are expensive because they have to operate in the moist treatment chamber, can be dispensed with. It is a further object of the invention to keep the loading chamber and the treatment chamber separated from one another in a virtually vapor-tight manner when the printing plate is undergoing treatment, and, in order to avoid losses of the treatment medium, only to extract small amounts of residual vapor from the loading chamber and discharge these into the atmosphere.

We have found that these objects are achieved with an apparatus wherein the loading chamber which also serves as the unloading chamber, and the treatment chamber are arranged above one another and the holder, with the printing plate mounted on it, can be moved substantially vertically up and sown through a slot in a horizontal partition between these two chambers, sealing of the slot, in the terminal positions of the holder, being effected by edge elements fixed on the said holder.

In a further embodiment of the invention, a counterweight for the holder which moves up and down is provided inside or outside the chambers, arranged one above the other, so that a drive motor of only low power is required. Further embodiments of the invention will become apparent from the accompanying drawing and the description which follows.

Figure 1:
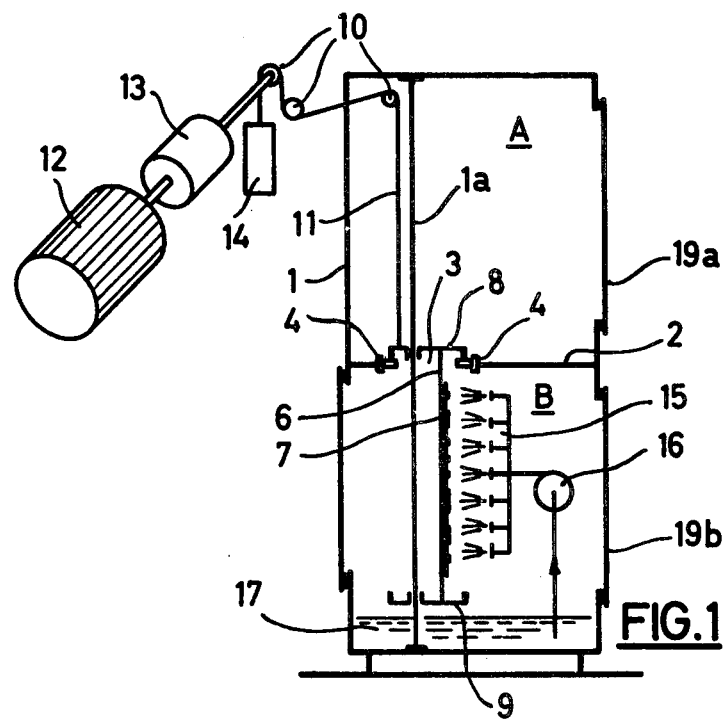
FIG. 1 is a schematic cross-sectional view of an apparatus which comprises the novel features, and in which the plate is in the treatment chamber.

The essentially cubic housing 1 is divided by a horizontal partition 2 into an upper loading and unloading chamber A and a treatment chamber B located below chamber A. A substantially rectangular aperture 3 is provided in the partition 2, and the edges of the aperture are fitted with, for example, U-shaped profiles 4, into which are inserted strips 5 of elastic material. The object of these strips 5 is to provide an elastic stop for the holder 6, which carries the printing plate 7 and moves vertically up and down between the loading and unloading chamber A and the lower treatment chamber B, when the said holder is moved to its upper and lower terminal positions. At the same time, the strips 5, in the end positions of the holder 6, provide an adequately tight seal, in the plane of the partition 2, between the chambers A and B. For this purpose, rectangular plates 8 and 9, and edge frames of appropriate size, are fixed to the top and bottom of the vertical base of the holder 7, the dimensions of the edge frames corresponding to those of the aperture 3 in the partition 2. The upper and lower edge frames on plates 8 and 9 may or may not be additionally provided with elastic sealing strips, which, in the two terminal positions of the holder, cooperate with the elastic strips 5 at the edges of the aperture 3 in the partition 2.

Figure 2:
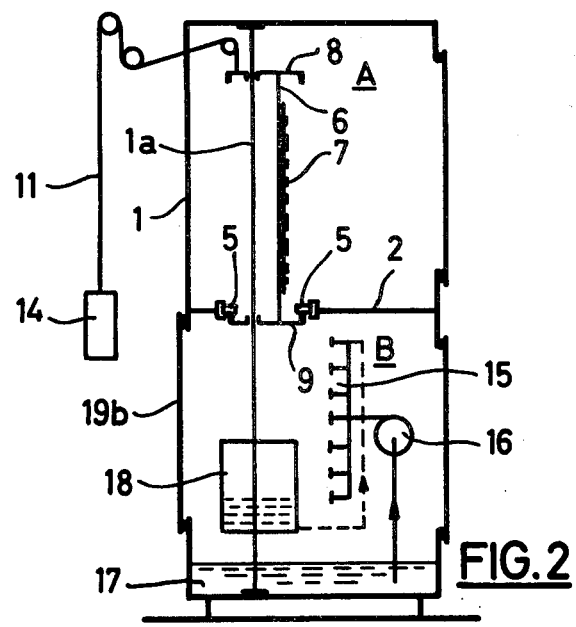
FIG. 2 is the same cross-sectional view of the apparatus, with the plate in the upper loading and unloading positions.

The upward and downward movement of the holder 6, with the plate 7 mounted thereon, is effected by a cable 11 guided over a system of pulleys 10, the inner end of which cable is preferably fixed to the upper plate 8 of the holder. A chain of corrosion-resistant material may for example be used instead of the cable. To effect movement of the holder, one of the pulleys 10 is driven by a motor 12, and an adjustable slip clutch 13 is interposed between this motor and the driven pulley 10. When the preset value is reached, the slip clutch interrupts the rotary movement imparted to the pulley 10 by the motor 12 and stops the holder in its upper terminal position (see FIG. 2). It is thus possible, by means of the adjustable slip clutch 13, to also set the pressure with which the edge frame on the lower rectangular plate 8 of the holder 6 bears against the elastic sealing strips 5 in the aperture 3 of the partition 2, and hence to isolate the moisture-laden atmosphere, produced by spraying, in chamber B from the substantially dry, upper chamber A. To keep the drive forces for effecting movement of the holder to a minimum, a counterweight 14 is attached to the cable 11, which compensates the weight of the holder 6 to the required degree. In FIGS. 1 and 2 the drive for the holder, comprising the pulleys 10, the motor 12 and the slip clutch 13, and the counterweight 14 are located outside the housing of the apparatus. It is of course also possible to accomodate the drive elements for the holder 6, including the counterweight 14, inside the housing.

Rectilinear guidance of the holder 6 as it moves vertically between its upper and lower terminal positions is ensured by a pair of rods 1a, the ends of which are connected to the housing 1. These rods pass through each of the upper and lower plates 8 and 9 to give a substantially tight seal.

The treatment chamber B accommodates, at a certain distance from the lowered holder 6, which carries the printing plate 7, a nozzle frame 15, the nozzles, arranged in rows thereon, serving, in the conventional manner, to spray, for example, the washout solution onto the exposed printing plate 7 by means of the pump 16. Preferably, the upper row of nozzles on the frame 15 constitute, in respect of its connections and its rate of delivery, a separate system by means of which, after the plate has been washed out, the rinsing liquid is sprayed against the surface of the plate, the washout and rinsing operations being program-controlled. Again in the conventional manner, the complete nozzle frame 15 executes — whilst the plate is being treated with the liquid media — an oscillating movement under the action of a drive motor which is not shown. Either the lower part of the treatment chamber B itself forms the main tank 17 for the washout solution, or a shallow container (for this purpose) is inserted in the housing 1 in the lower part of the chamber B. A further tank 18 for the rinsing medium is fixed in the chamber B at the side of the space required for movement of the holder 6.

In order to mount the printing plate 7 on the holder 6, and to remove the printing plate therefrom, when the holder is in its upper terminal position in chamber A, and in order to check and service the operating parts of the equipment in the treatment chamber B, one or more apertures 19a, 19b are provided in the housing which can be closed preferably by pivotable or vertically slidable doors.

A particularly inexpensive automatic program control system can be provided for the apparatus according to the invention and hence for the treatment of a printing plate, to be carried out therewith. For this purpose, contact switches and limit switches are arranged in the path of travel of the holder 6, and these switches automatically start, for example, the pump 16 for the treatment liquid, and the subsequent application of the rinsing liquid. As far as the upward movement of the holder 6, after treatment of the printing plate, is concerned, an intermediate stop is provided for the holder before the latter reaches its upper terminal position. This intermediate stop is so adjusted that the edge frame on the rectangular plate 8 comes to a halt before making contact with the sealing stirps 5 at the edges of the aperture 3 when the intermediate stop is reached. In this position, the residual treatment liquid and rinsing liquid can run off into the chamber B and hence virtually no moisture can enter the loading and unloading chamber A. Apertures through which, for example, solvent vapors are extracted whilst the apparatus is in operation are provided, in the conventional manner, in the walls which define the chamber A.

We claim:

1. An apparatus for treating photopolymer printing plates, comprising a printing plate holder which can travel in a controlled manner between a closable loading and unloading chamber and an adjoining treatment chamber, a battery of nozzles located in the treatment chamber, for the directionally controlled application of a treatment medium and of a rinsing medium, and corresponding tanks and collecting troughs, located within the chambers, for the liquid treatment media, wherein the loading and unloading chamber and the treatment chamber are arranged above on another and the holder, with the printing plate mounted on it, can be moved substantially vertically up and down through a slot in a partition between these two chambers, sealing of the slot, in the terminal positions of the holder, which is moved in the manner of an elevator, being effected by edge elements fixed on the said holder.

2. An apparatus according to claim 1, wherein the edges which define the slot in the partition, and the edge elements on the holder, are fitted with elastic sealing strips.

3. An apparatus as claimed in claim 1, wherein a counterweight is provided for the holder which travels up and down.

4. An apparatus as claimed in claim 1, with a motor-driven, vertically travelling holder, wherein the drive means comprise a slip clutch which interrupts the movement of the holder when a pre-determined contact pressure is attained between the elastic sealing strips at the edges of the slot and the edge elements of the holder.

5. An apparatus as claimed in claim 1, wherein an extraction line for residual vapors is connected to the loading and unloading chamber.

* * * * *